United States Patent [19]
Takimoto et al.

[11] Patent Number: 4,780,790
[45] Date of Patent: Oct. 25, 1988

[54] ELECTRIC DEVICE

[75] Inventors: Kiyoshi Takimoto; Haruki Kawada, both of Atsugi; Kunihiro Sakai, Yamato; Yoshinori Tomida; Hiroshi Matsuda, both of Atsugi; Kenji Saito, Yokohama; Ken Eguchi; Toshihiko Miyazaki, both of Atsugi, all of Japan

[73] Assignee: Canon Kabushiki Kaisha, Tokyo, Japan

[21] Appl. No.: 51,368

[22] Filed: May 19, 1987

[30] Foreign Application Priority Data

May 20, 1986 [JP] Japan .................. 61-113581
May 30, 1986 [JP] Japan .................. 61-123531
Jul. 29, 1986 [JP] Japan .................. 61-176683

[51] Int. Cl.$^4$ .............. H01G 4/08; H01G 4/38; H01C 7/18
[52] U.S. Cl. .................. 361/323; 361/330; 338/205
[58] Field of Search ............ 361/311–313, 361/328, 330, 323; 338/204, 205, 255; 437/1, 919; 29/25, 42; 357/51

[56] References Cited

U.S. PATENT DOCUMENTS 2,070,644 2/1937 Becker .................. 361/313 X
3,615,981 10/1971 Pratt et al. ............ 29/25.42 X
4,532,188 7/1985 Naarmann et al. .......... 437/1 X

FOREIGN PATENT DOCUMENTS 134922 10/1980 Japan .................. 361/313
1220567 1/1971 United Kingdom ........ 361/328

Primary Examiner—Donald A. Griffin
Attorney, Agent, or Firm—Fitzpatrick, Cella, Harper & Scinto

[57] ABSTRACT

An electronic device is provided which has a function of an organic film condensor. The device comprises a plural number of electroconductive layers each comprising a monomolecular film of an organic molecule having both of an electroconductive site and a hydrophobic site in combination or a built-up film thereof, and a dielectric layer of a monomolecular film of an organic molecule having both of a hydrophobic site in combination or a built-up film thereof between the electroconductive layers laminated on a substrate.

18 Claims, 8 Drawing Sheets

Fig. 10 a: EXAMPLE 1
b: EXAMPLE 2

ELECTRIC DEVICE

BACKGROUND OF THE INVENTION

1. Field of the Invention

This invention relates to an electronic device constituted by use of an organic material, more particularly to an electronic device formed by the monomolecular film built-up method. Particularly, the present invention relates to electronic devices having functions of condenser, resistance element, etc.

2. Description of the Related Art

In the prior art, as the material for circuit elements, inorganic materials have been employed generally, and use of organic material has been limited only to insulating materials and dielectric materials. For forming particularly a thin film condenser among the passive elements such as resistance, condenser, etc., necessary for constituting an electronic circuit with the use of an inorganic material, there have been primarily the two methods as shown below.

(1) A dielectric thin film such as of silicon oxide, a metal oxide, etc., is formed on a metal thin film according to the method such as vacuum vapor deposition or reactive sputtering, and further a thin metal film is formed thereon.

(2) The surface of a metal thin film formed by vacuum vapor deposition is oxidized to form a dielectric layer, and metal electrodes are formed thereon.

However, the method of forming an inorganic material as the dielectric layer by the above vacuum vapor deposition or reactive sputtering is not necessarily a simple method. On the other hand, a thin film resistance has been formed in the prior art with a material such as a metal, an alloy, a metal nitride, a thermet, etc., and the resistance value is controlled by two-dimentional trimming.

However, vacuum vapor deposition or reactive sputtering, etc., which is a means for preparing a thin film resistance of the above metal material, etc., is not necessarily a simple method. Also, the range for controlling resistance value is limited.

Meanwhile, in recent years, organic materials have been actively studied, and materials exhibiting metallic conductivity in a single crystal state, and further those exhibiting ultraconductivity at extremely low temperature have been reported. Materials exhibiting the properties as a semiconductor have also been reported, and under the present situation, various electrical characteristics can be attained with an organic material solely.

Specifically, in recent years, it has been reported that an amphiphilic charge transfer complex which is an organometallic compound having tetracyanoquinodimethane (TCNQ) as the electron acceptor having a long chain alkyl group as the hydrophobic site such as bis-tetracyanoquinodimethanedocosyl-pyridinium can form a monomolecular film on the water surface, and a monomolecular built-up film can be prepared by building up one layer by one layer said monomolecular films (Joint Research Seminar of Insulating Materials and Electronic Materials in Formation Material 1985/11/15 p. 29). Said monomolecular built-up film has an electroconductivity as much as 0.1 S/cm in the direction parallel to the film surface, while having an electroconductivity of about $10^{-14}$ S/cm in the direction perpendicular to the film, thus being observed to behave as an insulating material.

The above monomolecular built up film is obtained according to the Langmuir-Blodgett's method (LB method; Shin Jikken Kagaku Koza (New Experimental Chemical Course), Chapter 18, p. 498–507 published by Maruzen). The basic principle of this method is as described below.

When the valance between hydrophilic property and hydrophobic property is adequate, as the molecules having a hydrophilic group and a hydrophobic group in combination are spread over a water surface and their planar density is appropriately increased, they will for a monomolecular film with hydrophilic groups directed downwardly and hydrophobic groups upwardly on the water surface. In other word, such molecules behave as the two-dimensional particle system. When the density of molecules on the surface (hereinafter referred to as a planar density) is low, it is "gaseous film" where the state equation of two-dimensional ideal gas is valid between the area per one molecule (molecule occupying area) and the surface area, while when the planar density of molecules is made higher by increasing the surface pressure, the mutual interaction between molecules is intensified, whereby the molecules become "a condensed film (or a solid film)" of a two-dimensional solid. This state has high orderliness and uniformity with fairly regular arrangement and orientation of the molecules.

The agglomerated film thus formed can be transferred onto a substrate such as glass, and by transfer of the monomolecular films for a plural number of times in layers on the same substrate, a monomolecular-built up film can be obtained. As a method for transfer onto the substrate, there have been known the vertical dipping method, the horizontal lifting method, the rotatory drum method, etc.

Such an LB method is a thin film preparation method at a normal temperature and a normal pressure, and also has the specific feature in the point that the film thickness of the built-up film can be controlled by the built-up number.

The electroconductive thin film prepared according to the above LB method is constituted of molecules having a hydrophilic site comprising a charge transfer complex, etc., and a hydrophobic site comprising a long chain alkyl group, etc. In a state of a condensed film, the hydrophilic site exhibits electroconductivity in the direction parallel to the film surface due to great overlapping of electron clouds of the charge transfer complex constituting the hydrophilic site. On the other hand, the hydrophobic site will form an insulating portion because the long chain alkyl group is insulating. Thus, the built-up film obtained on the substrate according to the above LB method has a constitution in which electroconductive portions and insulating portions are laminated alternately.

Also, formation of a PN junction semiconductor comprising a complex system of a monomolecular built-up film of a triphenylmethane type dye has been reported.

To summarize, various electrical elements are primarily formed of inorganic materials in the prior art, and there is involved the problem that extremity conditions such as a high temperature or a high vacuum are essentially required during preparation or treatment of these electrical elements.

In various electrical elements, ultramicronization and higher densification are increasingly demanded, and for accomplishing these objects, there is a limit in inorganic materials as the base material, and therefore studies have been made about utilization of organic materials. By use of these organic materials, higher densification to some thousand-fold as compared with the use of inorganic materials of micron units of the prior art is possible.

However, since extremity conditions such as a high temperature or a high vacuum in inorganic materials cannot be applied to organic materials or biological materials, no electrical element utilizing organic material or biological material has been realized yet.

SUMMARY OF THE INVENTION

An object of the present invention is to provide an electrical element utilizing an organic material, specifically to provide an organic thin film condenser the which both of dielectric layer and electroconductive layer comprise organic materials, and which can be formed according to a simple method.

Another object of the present invention is to provide an organic thin film resistance element of which both the insulating layer and electroconductive layer comprise organic materials, and which can be prepared according to a simple method.

Still another object of the present invention is to provide a p-n heterojunction element with an organic material, for which no extremity condition such as a high temperature or vacuum is particularly required to be used.

According to an aspect of the present invention, there is provided an electronic device having a function of an organic film condenser, comprising a plural number of electroconductive layers each comprising a monomolecular film of an organic molecule having both of an electroconductive site and a hydrophobic site in combination or a built-up film thereof and a dielectric layer of a monomolecular film of an organic molecule having both of a hydrophilic site and a hydrophobic site in combination or a built-up film thereof between the electroconductive layers laminated on a substrate.

According to another aspect of the present invention, there is provided an electronic device having a function of an organic resistance element, comprising a resistor formed on a substrate by laminating an electroconductive monomolecular film of an organic molecule having both of a hydrophilic site and a hydrophobic site in combination or a built-up film thereof.

According to still another object of the present invention, there is provided an electronic device, comprising an organic electroconductive layer having a heterojunction surface between p-type organic electroconductive layer and n-type organic electroconductive layer formed in the same layer.

DETAILED DESCRIPTION OF THE INVENTION

First, the electronic device of the present invention having the function of an organic thin film condenser is to be explained. The present invention is directed to an electronic device having the function of an organic thin film condenser having an electroconductive layer comprising a monomolecular film or built-up films thereof of an organic molecule having both of a hydrophilic site and a hydrophobic site and a dielectric layer comprising a monomolecular film or built-up films thereof of an organic molecule having both of a hydrophilic site and a hydrophobic site, and also having two take-out electrodes, and it is an electronic device having the function of an organic thin film condenser characterized in that each of said electroconductive layers is connected alternately to different take-out electrodes.

Figure 1:
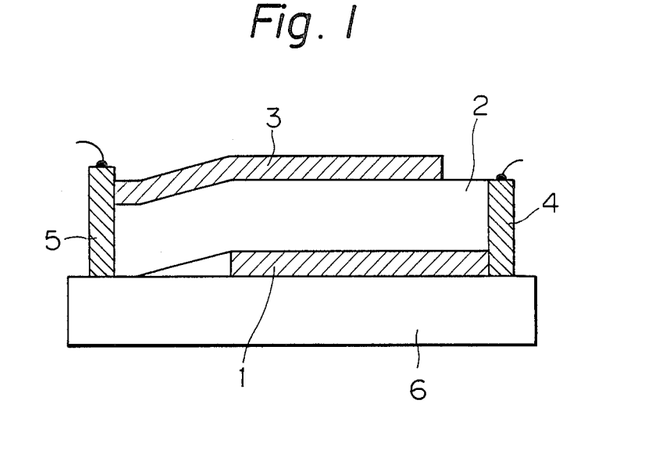
FIGS. 1 and 2 are sectional views of the embodiments of the organic thin film condenser of the present invention.
Figure 2:
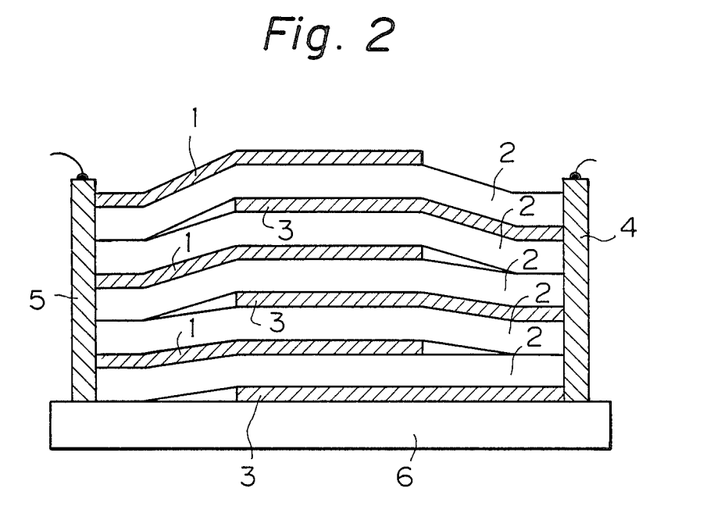

The embodiment of the present invention is shown in FIG. 1 and FIG. 2.

In the Figure, 1 denotes an electroconductive layer, 2 a dielectric layer, 3 an electroconductive layer, 4 and 5 are take-out electrodes for accumulating charges or taking out charges accumulated, and the electroconductive layer is connected to the take-out electrode 5 and the electroconductive layer 3 to the take-out electrode 4 so that electroconductive layers 1 and 3 may function as electrodes different from each other, 6 is a glass substrate, and each of electroconductive layers 1, 3 and dielectric layer 2 is formed according to an LB method.

Since a condenser with opposed electrodes of the electroconductive layers is formed as described above, the electrostatic capacity is determined by the area of the opposed electroconductive layers, the distance between the opposed electroconductive layers and the dielectric constant of the substance used for the dielectric layer, while the insulating dielectric strength is determined by the distance between the electroconductive layers and the substance used for the dielectric layer.

The distance between the electroconductive layers can be varied by varying the number of the built-up films of the dielectric material.

In the present invention, the organic substance used for electroconductive layers 1 and 3 is an amphiphilic substance having both of a hydrophilic site and a hydrophobic site, and, for example, an organic metal compound disclosed in Japanese Laid-open Patent Publication No. 246357/1985 can be used.

In the present invention, the organic substance used for the dielectric layer 2 is an amphiphilic substance having both of a hydrophilic site, and for example, a long chain fatty acid (e.g. saturated or unsaturated $C_{16}$–$C_{20}$ fatty acid) can be used.

Figure 3A:
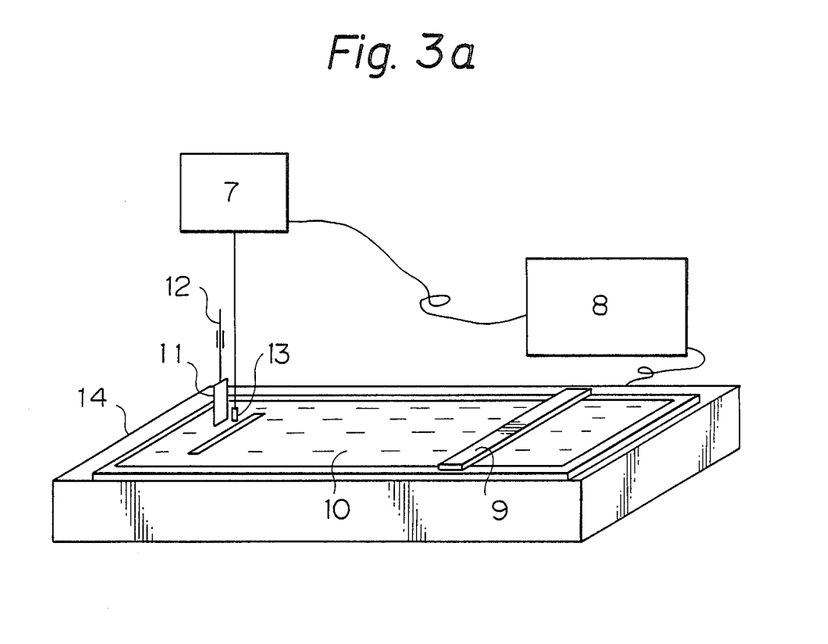
FIGS. 3a and 3b are a device for preparation of the organic thin film condenser of the present invention.
Figure 3B:
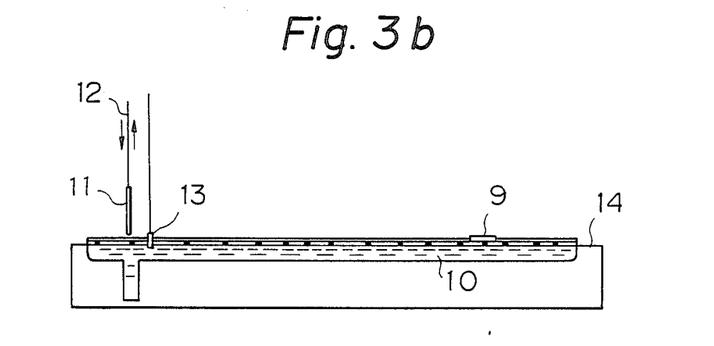

A device for preparation of the organic thin film condenser of the present invention is shown in FIGS. 3a and 3b.

In the Figures, 7 denotes a surface pressure gauge which is connected to a surface controlling device 8 to control movement of a moving fence 9, thereby maintaining a constant surface pressure. 10 denotes an aqueous phase which may be pure water or water containing metal ions. 11 is a substrate for forming a film (hereinafter referred to as a film-forming substrate), and 12 is a film-forming substrate holder and can be moved vertically.

The above device may be operated as described below.

First, the liquid surface is cleaned and a solution of electroconductive molecules or dielectric molecules dissolved in a solvent such as benzene, chloroform, acetonitrile-benzene (1:1), etc. is added dropwise onto the liquid surface to form a gaseous film. Next, the moving fence is gradually moved to the left side to narrow gradually the region of the liquid surface on which the molecules are spread to increase the planar density of the molecules, thereby forming a solid film. The state of this monomolecule film is monitored by measuring the surface pressure of the monomolecular film spread on the liquid surface by the surface pressure sensor 13. The movement to left and right of the moving fence 9 as mentioned above is controlled by measurement with this surface pressure sensor. Generally speaking, the surface pressure of the monomolecular film suitable for transfer onto the film-forming substrate 11 is in the range of from 15 to 30 dyn/cm, but the above range is a rough criterion, because suitable values of surface pressure may be outside the above range depending, for example, on the chemical structure of the film constituting substance, temperature conditions, etc.

By moving vertically the film-forming substrate 11 under the above condition, the monomolecular film which has become said solid film can be transferred and attached onto the surface of the substrate. Further, by transferring in layers monomolecular films for a plural number of times onto the same film-forming substrate 11, monomolecular built-up films can be obtained.

Vertical movement of the above film-forming substrate 11 is usually conducted at a speed of 0.1 to 1 cm/min.

Figure 4A:
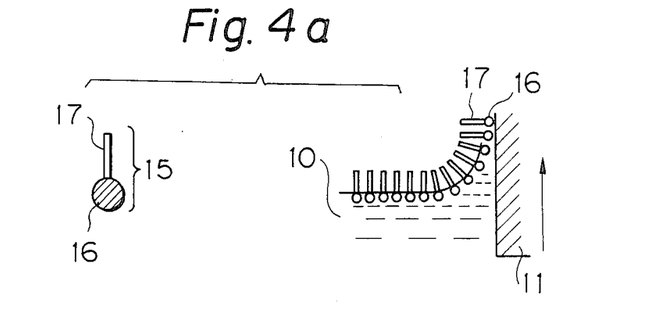
FIGS. 4a-4c are sectional views for illustrating schematically the method for preparing dielectric layer and electroconductive layer of the organic thin film condenser of the present invention.
Figure 4B:
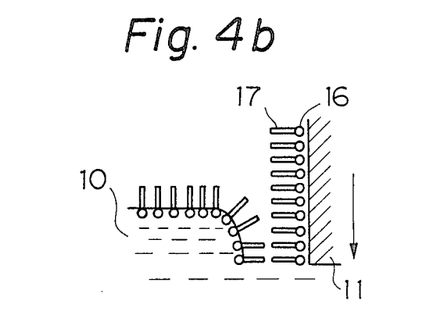
Figure 4C:
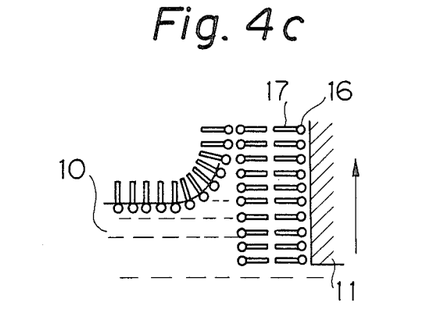

When the film-forming substrate 11 is hydrophilic, the monomolecular film is transferred as shown in FIG. 4a to FIG. 4c.

As shown in FIG. 4a, when the film forming substrate 11 is pulled up from below the liquid surface, the monomolecular film is transferred by attachment on the substrate 11 with the hydrophilic site 16 of the film constituting molecule being on the side of the film-forming substrate 11. Next, the film-forming substrate 11 being lowered as shown in FIG. 4b, the second layer of monomolecular film is transferred and attached onto the monomolecular film of the first layer with the hydrophobic site 17 of the film constituting molecule being on the substrate 11 side. When the film-forming substrate 11 is again pulled up, the monomolecular film of the third layer is transferred as shown in FIG. 4c, thus films are built-up in the same manner.

Whereas, as the monomolecular films on the liquid surface are transferred onto the film-forming substrate 11 as described above, the planar density of the molecules on the liquid surface will be reduced corresponding to the amount transferred onto the film-forming substrate 11, whereby the surface pressure will be also lowered. Without taking any measure, the monomolecular film on the liquid surface cannot maintain the state of a solid film, and the transfer of the film onto the substrate 11 will become interrupted. Accordingly, movement to right and left of the moving fence 9 is controlled by the above pressure sensor 13 also during transfer operations of monomolecular films onto the substrate 11, so that the surface pressure of the monomolecular film on the liquid surface can be maintained constant. Thus, the moving fence 9 is moved to left or right in response to minute increase or decrease of the surface pressure measured by the pressure sensor by an amount which cancels such minute increase or decrease.

The layer thickness of electroconductive layer and dielectric layer may be each 50 Å to 2 μm, preferably 90 Å to 5000 Å.

Next, the electronic device having the function of an organic thin film resistance element is explained below.

The present invention is an electronic device having the function of an organic thin film resistance element having a resistor formed by laminating electroconductive monomolecular film of an organic molecule having both of a hydrophilic site and hydrophobic site or built-up films thereof on a substrate. Also, the resistance value can be controlled by making cuttings in the resistor (patterning).

Figure 5A:
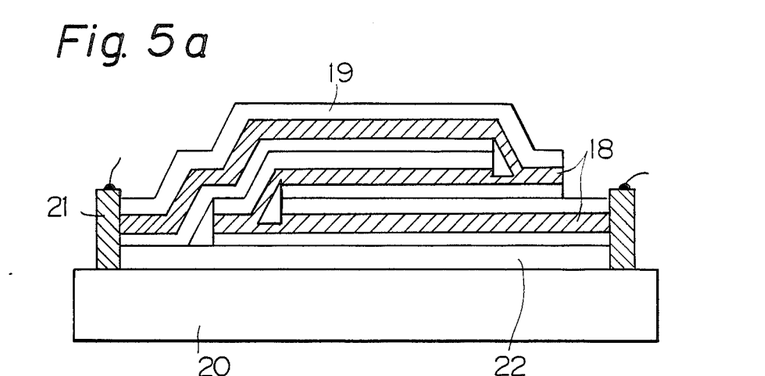
FIGS. 5a and 5b are schematic illustrations of the embodiment of the organic thin film resistance element, FIG. 5c showing the circuit diagram of FIG. 5, FIGS. 6a-6c are schematic plan views of the organic thin film resistance element of the present invention in which cuttings are formed.
Figure 5B:
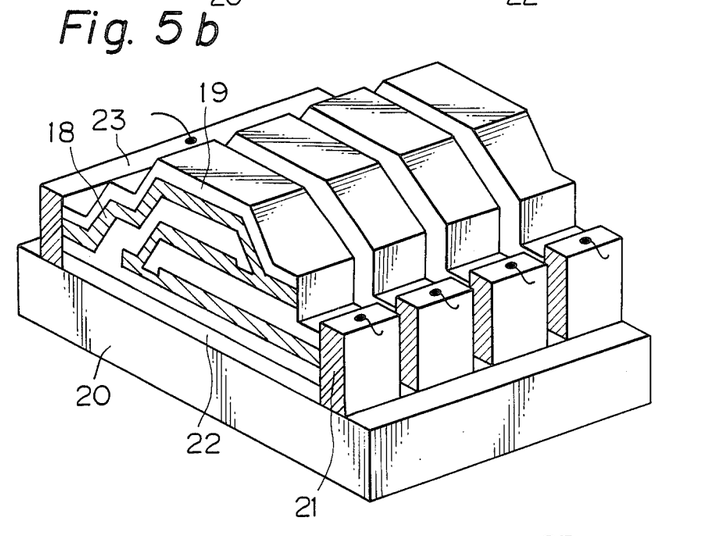

This embodiment is explained by use of FIGS. 5a and 5b.

The organic thin film resistance element shown in FIGS. 5a and 5b comprises a resistor, comprising a continuous electroconductive band constructed of an electroconductive monomolecular film of an organic molecule having both of a hydrophilic site and hydrophobic site which is folded so that the hydrophilic (electroconductive) sites interpose the hydrophobic (insulating) sites therebetween, laminated on a substrate having been subjected to subbing treatment.

In the Figures, 18 denotes an electroconductive layer; 19 an insulating layer; 20 a glass substrate; 21, 23 take-out electrodes, 22 is a subbing treatment layer, and the electroconductive layer 18 and the insulating layer 19 as mentioned here refer to microscopic electroconductive portion and insulating portion of one amphiphilic organic molecule.

The continuous electroconductive band comprises 6 layers of monomolecular films of amphiphilic organic molecule. The monomolecular films of the first and the second layers are laminated with the electroconductive sites placed inside, thereby forming a first electroconductive layer. Similarly, by the monomolecular films of the third and fourth layers, and the monomolecular layers of the fifth and sixth layers from the substrate, a second electroconductive layer and a third electroconductive layer are formed. Since the monomolecular films of the first layer and the fourth layer are connected to each other and the electroconductive sites at the end portions crossing over the monomolecular films of the second layer and the third layer, and also similarly the monomolecular films of the third and the sixth layer are connected to each other at the electroconductive sites, the first, the second, and the third electroconductive layers are connected to one another to constitute a continuous electroconductive band.

The monomolecular built-up film folded under the state in which insulating layers and electroconductive layers are alternately built up as described above can control the width and length as the electroconductive pathway of the electroconductive site over a wide range by a three dimensional patterning in which vertical patterning by folding and patterning in the plane direction known in the art are used in combination. Since resistance value is inversely proportional to the width of electroconductive path and proportional to its length, the organic thin film resistance element of the present invention can be controlled in its resistance value over a wide range.

In the present invention, as the amphiphilic organic substance having both of a hydrophilic site and hydrophobic site to be used as the resistance material, organic metal compounds as disclosed in Japanese Laid-open Patent Publication No. 246357/1985 can be used.

A device for preparing the organic thin film resistance element of the present invention is as shown in FIGS. 3a and 3b.

The film forming method is the same as described above.

Finally, among electronic devices, an electronic device of a p-n heterojunction element is explained which is characterized in that an organic electroconductive layer having a heterojunction interface between a p-type organic electroconductive layer and an n-type organic electroconductive layer and an organic insulating layer are laminated.

Figure 9:
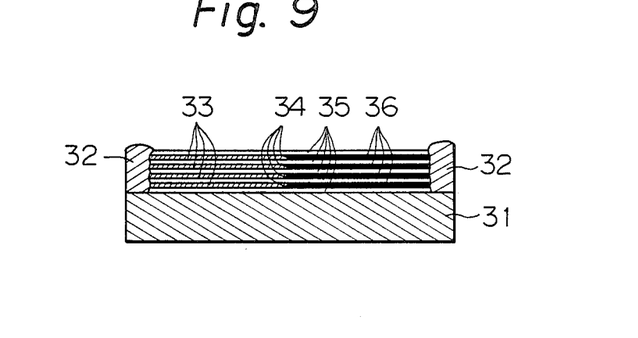
FIG. 9 is a diagramatic illustration of the cross-section of the p-n junction element of the present invention.

The p-n heterojunction element of the present invention is described in more detail by referring to FIG. 9 which illustrates diagrammatically its structure.

The p-n heterojunction element of the present invention has basically a p-type organic electroconductive layer 33 and a n-type organic electroconductive layer 36 arranged in the horizontal direction on any desired substrate 31 as shown in FIG. 9, and the ends of those layers have mutually a heterojunction surface 34, and p-n heterojunction electroconductive layers subjected to such heterojunction and organic insulating layers are laminated alternately in any desired number of lamination.

The example shown in FIG. 9 illustrates diagrammatically the basic embodiment of the p-n heterojunction element of the present invention, and other constitutions are also included, so long as the p-type organic electroconductive layer 33 and the n-type organic electroconductive layer 36 form p-n junction as shown in FIG. 9, and also laminated alternately with organic insulating layers 35.

For example, the p-n-junctioned organic electroconductive layer (33+36) and the organic insulating layer 35 may be provided each as one layer, or further a plural number layers as shown in the Figure may be provided. Further, some tens or some hundreds of layers may be alternately laminated. Also, while the example shown in the Figure has one site of p-n junction per one layer, it may also have a plural number of p-n junctions such as P-N-P, P-N-P-N, etc. The external electrodes 32 are not also limited to two, but a plural number of electrodes can naturally be provided at desired sites. The p-n-junctioned organic electroconductive layer may be laminated through the organic insulating layer 35 on the substrate 31, or it may be directly in contact with the substrate 31.

The n-type organic electroconductive layer forming the p-n heterojunction element of the present invention having the constitution as described above may be any organic material capable of forming a n-type organic electroconductive layer, but a preferable material is a charge transfer complex having a hydrophilic site, a hydrophobic site and an electroconductive site in combination in one molecule. Although any of charge transfer complex is known in the art having such conditions may be available in the present invention, preferable compounds in the present invention are charge transfer complexes of which hydrophilic site is quaternary ammonium group, the hydrophobic site is a hydrophobic hydrocarbon group such as alkyl group, aryl group, alkylaryl group, etc., and the electroconductive site is tetracyanoquinodimethane or a derivative thereof or a homologue thereof. Examples of preferable compounds as the above charge transfer complexes may include the following compounds.

(1)

(2)

(3)

(4)

(5)

(6)

-continued

R in the above compounds is hydrophobic site, which is an alkyl, aryl, or alkylaryl group, preferably an alkyl group having 12 to 30 carbon atoms. $R_1$ is a lower alkyl group, n and q are 0, 1 or 2, m is 0 or 1, and X is an anion group such as halogen, etc. Y is oxygen, sulfur or selenium.

The compounds as mentioned above may further have a polymerizable group such as double bond or triple bond in the alkyl group, and can also have one or more substituents such as alkyl group, alkenyl group, cyano group, alkoxy group, halogen, etc., on the heterocyclic ring.

TCNQ is a compound represented by the following formula:

The above compound can have any desired substituents such as alkyl group, alkenyl group, halogen atoms, etc., at the positions a–d in the above formula. Also, in place of the above TCNQ, a homologue of TCNQ such as a compound of the following structure, etc., can be also used:

On the other hand, the material for forming a p-type organic electroconductive layer may be any organic material capable of forming such p-type organic electroconductive layer, but preferable organic compounds in the present invention are compounds which are charge transfer complexes having a hydrophilic site, a hydrophobic site and an electroconductive site in combination in one molecule similarly as the organic materials for forming n-type organic electroconductive layer as described above, and in which the hydrophilic site is an anionic group and the electroconductive site is cationic.

Although any of the charge transfer complexes known in the art having such conditions may be available, preferable compounds in the present invention are those in which the hydrophilic site is sulfonic acid group, the hydrophobic site is a hydrophobic hydrocarbon group such as alkyl group, aryl group, alkylaryl group, etc., and the electroconductive site is tetrathiofulvalene, a derivative thereof or an analogue thereof. Preferable compounds as the above charge transfer complex may include those of the following formulae:

In the above formulae, R is a hydrophobic site, preferably an alkyl group having 12 to 30 carbon atoms. B is an aromatic ring such as phenyl, naphthyl, etc., and n is 1 or 2. The compounds as mentioned above may further have a polymerizable group such as double bond or triple bond in the alkyl group, and can also have one or more substituents such as alkyl group alkenyl group, cyano group, alkoxy group, halogen, etc., on the aromatic ring.

TTF is tetrathiofulvalene or a derivative thereof or an analogue thereof, as exampified by those having the following structures:

The above compounds can further have one or more substituents such as alkyl group, alkenyl group, cyano group, alkoxy group, halogen, etc.

The p-n heterojunction element of the present invention can be obtained with the use of a p-type charge transfer complex and a n-type charge transfer complex as described above by forming monomolecular films of these charge transfer complexes or built-up films thereof on a substrate from these charge transfer complexes. More specifically, either one of the p-type charge transfer complex and the n-type charge transfer complex as described above can be formed as a monomolecular film or its built-up films on any desired substrate according to the known method such as the Langmuir-Blodgett's method developed by Langmuir et al, and the p-n heterojunction element of the present invention can be obtained by forming a LB film so that the monomolecular film of the p-type charge transfer complex and the monomolecular film of the n-type charge transfer complex may be subjected to p-n junction at their layer ends on the substrate 2 during formation of such LB film.

In the present invention, the preferable method for forming an electroconductive layer of p-n heterojunction element on the surface of any desired substrate by use of the above charge transfer complexes is an LB method. The film forming method of said electroconductive layer is as described above (see FIG. 3). The film forming method may be the same as described above, but the LB method may be applied for the p-n heterojunction as in the present invention as described in detail below.

The example shown in FIG. 8 shows the state in which a partitioning plate 29 is provided, and a monomolecular film 28 of a p-type charge transfer complex and a monomolecular film 30 of a n-type charge transfer complex are spread on both sides thereof.

By controlling the two kinds of monomolecular films spread as described above with the surface state as the parameter, the monomolecular film 28 of the p-type charge transfer complex and the monomolecular film 30 of the n-type charge transfer complex are made monomolecular films with appropriate surface pressures by moving the float 27. Next, by removing gently the partitioning plate 29, the monomolecular film 28 of the p-type transfer complex and the monomolecular film 30 of the n-type charge transfer complex are subjected to junction at their film ends, namely p-n junction. Then, by controlling the position of the substrate 31 so that the center of the substrate 31 may substantially coincide with the p-n junction interface, descending the substrate 31 so that it may transverse the water surface, and then reversing the substrate so that it may be elevated so as to transverse the water surface, two layers of monomolecular films having p-n junction are laminated substantially at the center of the surface of the substrate 31. By repeating such operations, monomolecular films can be laminated in any desired layer number on the substrate 31. Of course, in repeating such operations, the surface pressure of the monomolecular film and the p-n junction interface should be maintained constantly, and such control of surface pressure and the position of junction interface is possible by controlling the position of the float 27.

The organic electroconductive layer of the p-n heterojunction element formed as described above has the p-type organic electroconductive layer and the n-type organic electroconductive layer subjected to p-n junction at their ends as shown in FIG. 9 as already described, and the junctioned organic electroconductive layers have the structure alternately laminated with organic insulating layers generated by the hydrophobic group of the charge transfer complex.

In the present invention, the substrate for forming a p-n heterojunction element comprising a monomolecular film of a charge transfer complex as described above or its built-up film thereon may be any material such as a metal, glass, ceramic, plastic materials, etc., and further a biological material having remarkably low heat resistance can be also used. An electroconductive material such as a metal can also be used, because monomolecular film or built-up films have sufficient insulating property in the direction perpendicular to the film.

The substrate as described above may have any desired shape and, although a flat plate shape is preferable, the present invention is not limited to flat plates. This is because the present invention has the advantage that regardless of the shape of the surface of the substrate, the film can be formed in conformity with the shape.

The methods as exemplified above are representative methods, and any of the methods bringing about the same effect as described above can be utilized in the present invention.

Also, in the present invention, when the charge transfer complex employed has a polymerizable group, after formation of the film as described above, these films can be also cured by polymerization before or after formation of the p-n heterojunction element to improve remarkably the film strength.

According to the present invention as described above, since no heating step of high temperature is particularly required in formation of a p-n heterojunction element with an electroconductive organic material, the substrate to be used is not limited in its material at all, but any desired substrate such as inorganic materials, living bodies, etc. can be used.

From the above points, according to the present invention, the electronic device with a p-n heterojunction structure obtained by the method of the present invention can be greatly expected not only as the p-n heterojunction element of the prior art as a matter of course, but also as an element of bioelectronics utilizing living bodies.

The present invention is described in detail below by referring to Examples.

EXAMPLE 1

A condenser of the simplest constitution as shown in FIG. 1 was formed by use of a device as shown in FIGS. 3a and 3b.

As the constituent molecules of the electroconductive layers 1 and 3, bistetracyanoquinodimethane-docosylpyridinium was used, and after this was dissolved in a 1:1 solvent mixture of acetonitrile and benzene at a concentration of 1 mg/ml, the resultant solution was spread over the aqueous phase of the device shown in FIG. 3a with a $CdCl_2$ concentration of $4 \times 10^{-4}$ mol/l and a water temperature of 17° C. adjusted to pH 6.8 with $KHCO_3$.

After evaporation of the solvent of acetonitrile and benzene, the surface pressure was enhanced to 20 dyn/cm and monomolecular films were formed. With the surface pressure maintained constant, a clean glass substrate (10 mm×30 mm) previously dipped into the aqueous phase was dipped gently to the depth of 20 mm at a speed of 3 mm/min in the direction transversing the water surface, and again withdrawn gently 20 mm at a speed of 3 mm/min, to have three layers of monomolecular films built up, thus forming an electroconductive layer 1.

After the water surface was cleaned, a chloroform solution of arachidic acid, with a concentration of 1 mg/ml was spread over the aqueous phase, and after evaporation of chloroform, the surface pressure was enhanced to 30 dyn/cm, and while this pressure was maintained, cadmium arachidate monomolecular films were built up on said substrate. The substrate speed was made 10 mm/min during both dipping and withdrawing, and 40 layers of cadmium arachidate monomolecular films were built up to obtain a dielectric layer 2. Further, with the upper and lower portions of the substrate with respect to the dipping direction being reversed, two layers of bistetracyanoquinodimethane-docosylpyridinium monomolecular films were built up under the same conditions as in the case of forming the electroconductive layer 1 to form an electroconductive layer 3.

Subsequently, by use of an electroconductive paste, take-out electrodes were provided as shown in FIG. 1 at the end portions of the electroconductive layers 1, 3 to prepare an organic thin film condenser of the present invention. With the take-out electrodes being connected to an external circuit, electrostatic capacity was measured to obtain a value of 0.02 $\mu F$.

EXAMPLE 2

A condenser of the constitution as shown in FIG. 2 was formed by use of a device as shown in FIGS. 3a and 3b.

After formation of the electroconductive layer 3 in Example 1, 40 layers of cadmium arachidate monomolecular films were again built up, and after the substrate were turned upside down, two layers of bistetracyanoquinodimethane-docosylpyridinium monomolecular films were built up, and following sequentially the same steps, a laminated plate with 6 sheets of electrodes was prepared. The film forming conditions were the same as in Example 1. Next, take-out electrodes were provided in the same manner as in Example 1 to prepare an organic thin film condenser of the present invention. As the result of measurement of electrostatic capacity, a value approximately 5-fold of that in Example 1 was obtained.

EXAMPLE 3

Organic thin film condensers were prepared by varying the number of the cadmium arachidate monomolecular films used as the dielectric layer in Example 1 as 80 layers, 60 layers, 40 layers, 30 layers, 20 layers and 10 layers. Other steps and the film forming conditions were all the same as in Example 1. By providing take-out electrodes and measuring electrostatic capacity similarly as described in Example 1, it was consequently confirmed that an inversely proportional relation exists between the number of dielectric layers built up and electrostatic capacity. However, in the case when the number of dielectric layers built up is ten layers, the insulating dielectric strength was found to be several volts or less.

EXAMPLE 4

In Example 1, the number of electroconductive layers 1 and 3 built up were changed to 11 layers and 10 layers respectively to prepare an organic thin film condenser. The steps and film conditions are all the same as in Example 1. Also, the number of cadmium arachidate monomolecular films built up used as the dielectric layer was made 40. Take-out electrodes were provided in the same manner as in Example 1, and electrical transient characteristics were measured. Since conductivity of the electroconductive layer became higher as compared with the product prepared in Example 1, transient characteristics could be remarkably improved.

EXAMPLE 5

Figure 6A:
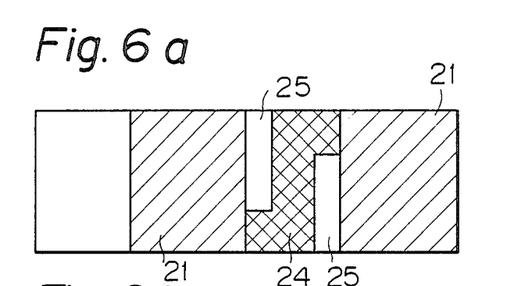
Figure 6B:
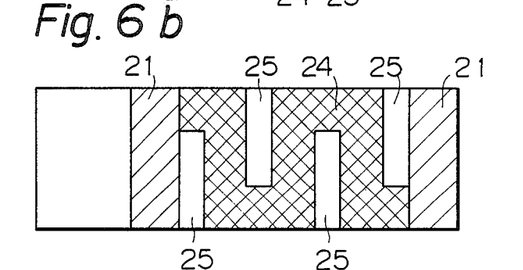
Figure 6C:
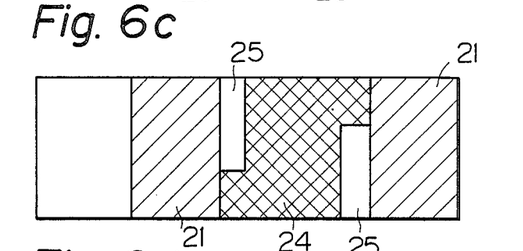
Figure 6D:
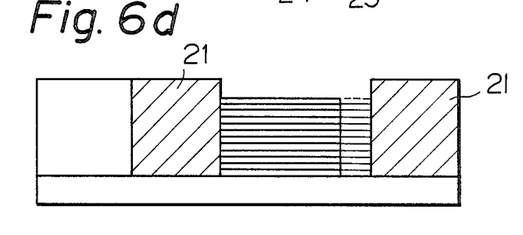
FIG. 6d is a schematic sectional view of FIG. 6c.

An organic thin film resistant element of the constitution as shown by the schematic plan view in FIGS. 6a to 6c was formed by use of a device as shown in FIGS. 3a and 3b.

By use of bistetracyanoquinodimethane-docosylpyridinium as the constituent molecules of the resistor, after this was dissolved in a 1:1 solvent mixture of acetonitrile and benzene at a concentration of 1 mg/ml, the resultant solution was spread over the aqueous phase in a device shown in FIG. 3a with a $CdCl_2$ concentration of $4 \times 10^{-4}$ mol/liter and a water temperature of 17° C. adjusted to pH 6.8 with $KHCO_3$.

After evaporation of the solvents of acetonitrile and benzene, the surface pressure was increased to 20 dyn/cm and monomolecular films were formed. While the surface pressure was maintained constant, a clean glass substrate (10 mm $\times$ 30 mm) which had been dipped in the aqueous phase was withdrawn gently at a speed of 5 mm/min in the direction transversing the water surface, and subsequently dipped gently at a speed of 5 mm/min. These steps were repeated to build up 11 layers of monomolecular films.

Next, by effecting trimming by use of Ar laser (30 mW) on the monomolecular built-up film to form a cutting 25 as shown in FIG. 6a, an organic thin film resistant element was obtained with the width of current passage 24 being 3 mm.

This organic thin film resistant element was connected to external electrodes by use of an electroconductive paste, and resistance measured was 400 K$\Omega$.

Further, resistant elements with increased number of cuttings 25 and varied width of current pathway 24 were prepared, and resistances were measured to obtain the value of 1 M$\Omega$, 150 K$\Omega$, respectively.

EXAMPLE 6

Figure 7A:
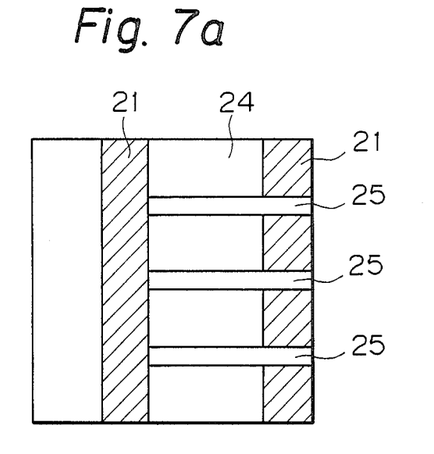
FIGS. 7a and 7b are schematic plan views of the organic thin film resistance element of the present invention in which a plural number of resistances are formed by forming cuttings passing through the device.

After 11 layers of dimethyl-docosylpyridinium monomolecular films were built up on a glass substrate of 30 mm $\times$ 30 mm under the same conditions as in Example 1, three parallel cuttings 25 were formed from one end of the substrate by laser trimming as shown in FIG. 7a to form four current pathway with a width of 6 mm and a length of 10 mm. Thus a resistant array including four 200 K$\Omega$ resistances (organic thin film resistance element of the present invention) could be prepared.

Figure 7B:
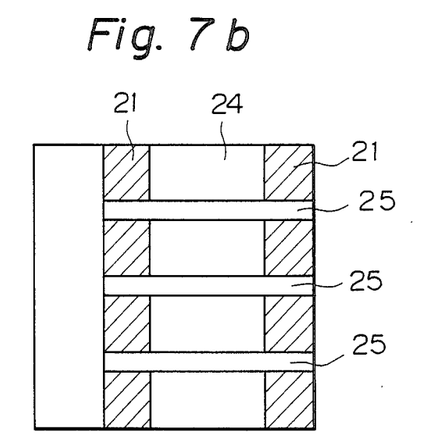

Further, by making cuttings from one end of the substrate to the opposed one end, four independent resistant arrayes could be formed (FIG. 7b).

EXAMPLE 7

First, the substrate surface was subjected to hydrophobic treatment by building up 3 layers of cadmium arachidate monomolecular films. Under the same conditions as in Example 5, bistetracyanoquinodimethane-docosylpyridinium monomolecular film was formed over the aqueous phase, and the substrate was dipped gently to about 20 mm at a speed of 5 mm/min (formation of the first layer). Once the water surface was cleaned, and the substrate was withdrawn by about 5 mm and thereafter bistetracyanoquinodimethane-docosylpyridinium monomolecular film was again formed on the aqueous phase, and the substrate was withdrawn gently at a speed of 5 mm/min (formation of the second layer). Again the water surface was cleaned, and the lower end of the substrate was dipped to 5 mm below the water surface, and bistetracyanoquinodimethane-docosylpyridinium monomolecular film was formed on the water surface and the substrate was dipped gently at a speed of 5 mm/min (formation of the third layer). When the upper end of the second layer reached the water surface, dipping was discontinued and then with the water surface being cleaned, the substrate was dipped until the water surface and the upper end of the first layer coincided with each other, followed by formation of bistetracyanoquinodimethane-docosylpyridinium monomolecular film on the water surface. Further, the substrate was gently withdrawn at a speed of 5 mm/min (formation of the fourth layer), and when the lower end of the third layer reached the position which was about 3 mm below the water surface, the substrate was dipped gently at a speed of 5 mm/min (formation of the fifth layer). When the upper end of the fourth layer sunk to about 5 mm below the water surface, dipping was discontinued and then the substrate was gently withdrawn at a speed of 5 mm/min (formation of the sixth layer). When the lower end of the third layer reached the water surface, withdrawing was discontinued and with the water surface being cleaned, the substrate was completely withdrawn. Thus, a layer constitution with three stages of electroconductive layers comprising two layers of monomolecular films being folded as shown in FIG. 1a was formed to obtain an organic thin film resistant element of the present invention. The current passage in this case had a width of 3 cm and a resistance was measured to be 600 K$\Omega$.

Figure 5C:
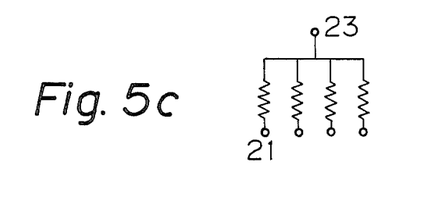

Further, on the organic thin film resistant element obtained as described above, three parallel cuttings were formed from one end of the substrate by laser trimming as shown in FIG. 7 to prepare four current pathways with a width of 6 mm and a length of 10 mm. Thus a resistant array including four 3 M$\Omega$ resistances as shown in the circuit diagram in FIG. 5c (organic thin film resistant element of the invention) was obtained.

EXAMPLE 8

Figure 8A:
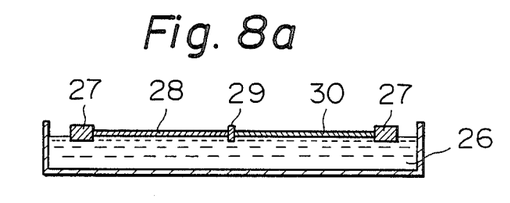
FIGS. 8a-8d illustrates diagramatically the preparation steps of the p-n junction element of the present invention.
Figure 8B:
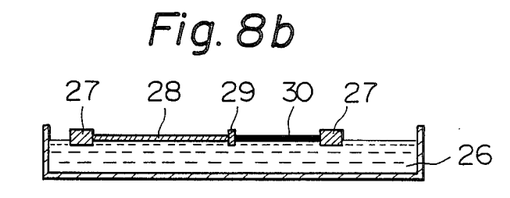
Figure 8C:
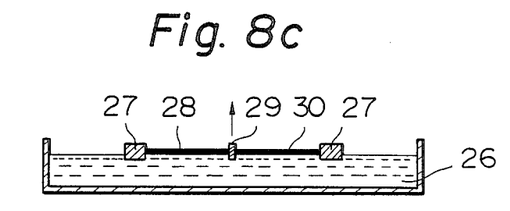
Figure 8D:
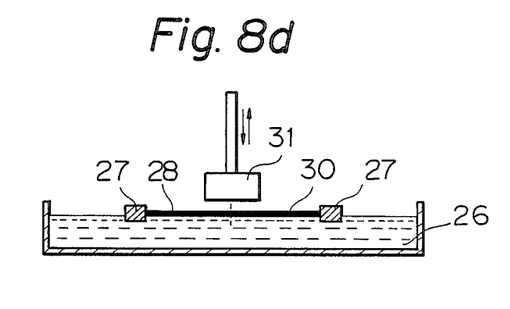

In a 1:1 solvent mixture of acetonitrile and benzene was dissolved at a concentration of 1 mg/ml to prepare a solution of a n-type charge transfer complex. On the other hand, a water tank devided into left and right sections by a partitioning plate 29 as shown in FIG. 8 was prepared. And an aqueous phase containing $CdCl_2$ at a concentration of $4\times10^{-4}$ mol/l and a water temperature of 17° C. adjusted to pH 6.8 with $KHCO_3$ was placed into the tank, and the above solution was poured onto one of the sections to spread the solution over the aqueous phase.

After evaporation of the solvents of acetonitrile and benzene, the surface pressure was enhanced to 20 dyn/cm and a n-type monomolecular film was formed.

After a p-type monomolecular film of $CH_3(CH_2)_{17}SO_3{}^-[TMTTF]_2{}^+$ (TMTTF is tetramethyltetrathiofulvalene) was formed over the aqueous phase in the other section similarly as described above, the partitioning plate which partitioned the two monomolecular films was gently removed to form a p-n junction interface of the two kinds of monomolecular films. While the surface pressure was maintained at 20 dyn/cm, a clean glass substrate subjected to the hydrophobic treatment of the surface (having 3 layers of cadmium arachidate built up according to an LB method) was dipped gently at a speed of 15 mm/min to build up a monomolecular film having one layer of p-n junction interface. Subsequently, the glass substrate was withdrawn gently at a speed of 10 mm/min to build up the second layer. This built-up operation was repeated 10 times as the total to build up 20 layers of monomolecular films having p-n junction interface.

Figure 10:
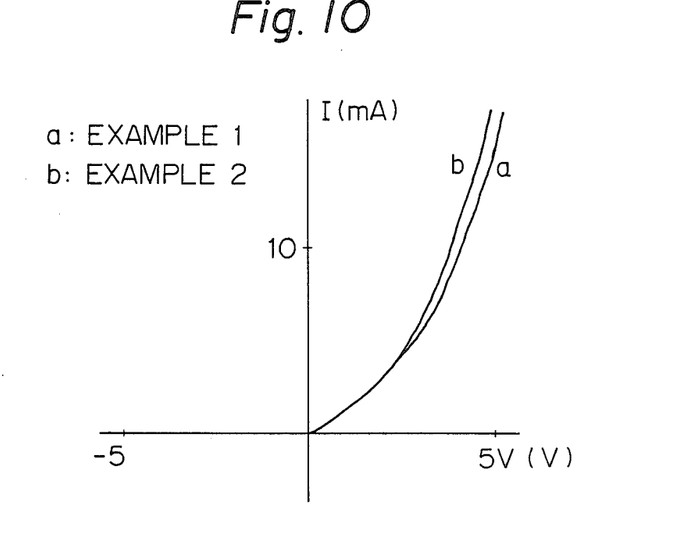
FIG. 10 is a graph showing the voltage-current characteristics in an Example of the present invention.

Next, on the n-type organic electroconductive layer containing TMTTF were formed externally connected electrodes by use of an electroconductive paste according to the known method to prepare a p-n junction diode of the present invention as shown in FIG. 9. As the result of measurement of the voltage-current characteristics of this diode, the rectifying characteristics as shown in FIG. 10 were obtained. The rectification ratio at an application voltage of 5 V was found to be 350.

EXAMPLE 9

In the same manner as in Example 8 except for using in place of a p-n junction diode was prepared and the voltage-current characteristics were measured. The rectification ratio at an application voltage of 5 V was found to be 355. Its voltage-current curve is shown in FIG. 10.

EXAMPLES 10-12

By use of the compounds as shown below, p-n junction diodes were prepared in the same manner as in Example 8, and their rectification ratios were measured to obtain the same results as in Examples 8 and 9.

EXAMPLE 10 n-Type monomolecular film $CH_3(CH_2)_{21}{}^{\oplus}N \qquad N.[TCNQ]_2{}^{\ominus}$ p-Type monomolecular film $CH_3(CH_2)_{21}SO_3{}^{\ominus}.[TTF]_2{}^{\oplus}$

Rectification ratio    340

EXAMPLE 11 n-Type monomolecular film $CH_3(CH_2)_{21}{}^{\oplus}N \qquad .[TNAP]_2{}^{\ominus}$ p-Type monomolecular film $CH_3(CH_2)_{21}SO_3{}^{\ominus}.[TMTTF]_2{}^{\oplus}$

Rectification ratio    350

EXAMPLE 12 n-Type monomolecular film $CH_3(CH_2)_{21}{}^{\oplus}N \qquad .[TCNQ]_2{}^{\ominus}$ p-Type monomolecular film $CH_3(CH_2)_{21}SO_3{}^{\ominus}.[HMTTF]_2{}^{\oplus}$ Rectification ratio    335

Note:
TCNQ = tetracyanoquinodimethane
TTF = tetrathiofulvalene
TNAP = 11,11,12,12-tetracyano-2,6-naphthaquinodimethane
TMTTF = tetramethyltetrathiofulvalene
HMTTF = hexamethyltetrathiofulvalene The electronic device of the present invention is an electronic device making avail of various kinds of characteristics, and the electronic device having the function of an organic thin film condenser of the present invention has electroconductive layer and dielectric layer consisting only of organic substances, and therefore can be prepared easily under normal temperature and normal pressure, and besides has a thin film with very uniform interelectrode distance, whereby very uniform electrical field can be obtained between electrodes to give the effect that high designing performance can be obtained.

Also, the electronic device usable as organic thin film resistance element of the present invention has electroconductive layer and insulating layer both of which consist of organic substances, and have the effect that it can be easily prepared because the electroconductive layer and the insulating layer can be formed by one lamination treatment, and also that it can be prepared easily also at a normal temperature and a normal pressure.

Further, the present invention has the effect that an electronic device formed of a p-n heterojunction structure can be prepared without use of extremity conditions such as high temperature, vacuum, etc.

What is claimed is:

1. An electronic device having a function of an organic film condenser, comprising a plural number of electroconductive layers each comprising a monomolecular film of an organic molecule having both of an electroconductive site and a hydrophobic site in combination or a built-up film thereof and a dielectric layer of a monomolecular film of an organic molecule having both of a hydrophilic site and a hydrophobic site in combination or a built-up film thereof between the electroconductive layers laminated on a substrate.

2. An electronic device according to claim 1, wherein said electroconductive layer has a layer thickness of 50 Å to 2 μm.

3. An electronic device according to claim 1, wherein said electroconductive layer has a layer thickness of 90 Å to 5000 Å.

4. An electronic device according to claim 1, wherein said dielectric layer has a layer thickness of 50 Å to 2 μm.

5. An electronic device according to claim 1, wherein said dielectric layer has a layer thickness of 90 Å to 5000 Å.

6. An electronic device according to claim 1, wherein said electroconductive site contains quaternary ammonium salt.

7. An electronic device according to claim 1, wherein said electroconductive layer is formed according to an LB method.

8. An electronic device according to claim 1, wherein said dielectric layer is formed according to an LB method.

9. An electronic device having a function of an organic resistance element, comprising a resistor formed on a substrate by laminating as a continuous electroconductive band an electroconductive monomolecular film of an organic molecule having both of a hydrophilic site and a hydrophobic site in combination or a built-up film thereof, wherein the hydrophilic sites of said electroconductive monomolecular film are folded with said hydrophobic sites sandwiched therebetween.

10. An electronic device according to claim 9, wherein cuttings are made on said electroconductive monomolecular film or a built-up film thereof.

11. An electronic device according to claim 9, wherein said electroconductive monomolecular film or built-up film thereof is formed according to an LB method.

12. An electronic device according to claim 9, wherein said hydrophilic site is electroconductive site.

13. An electronic device, comprising an organic electroconductive layer having a heterojunction surface between p-type organic electroconductive layer and n-type organic electroconductive layer formed in the same layer.

14. An electronic device according to claim 13, wherein the p-n heterojunction is formed by lamination of an organic electroconductive layer having a heterojunction surface between p-type organic electroconductive layer and n-type organic electroconductive layer and an organic insulating layer.

15. An electronic device according to claim 14, wherein said p-type organic electroconductive layer and n-type organic electroconductive layer is formed of a monomolecular film of a charge transfer complex having a hydrophilic site, a hydrophobic site and an electroconductive site in the same molecule in combination or a built-up film thereof.

16. An electronic device according to claim 15, wherein the charge transfer complex forming said n-type organic electroconductive layer is a complex of a quaternary ammonium salt and tetracyanoquinodimethane and a derivative thereof or an analoque thereof.

17. An electronic device according to claim 15, wherein the charge transfer complex forming said p-type organic electroconductive layer is a complex of sulfonic acid and tetrathiofulvalene or a derivative thereof or a homologue thereof.

18. An electronic device according to claim 15, wherein said organic electroconductive layer is formed according to an LB method.

* * * * *